United States Patent [19]

Laughlin

[11] 4,236,069

[45] Nov. 25, 1980

[54] AVALANCHE PHOTODIODE GAIN CONTROL SYSTEM

[75] Inventor: Richard H. Laughlin, Richardson, Tex.

[73] Assignee: Varo, Inc., Garland, Tex.

[21] Appl. No.: 951,791

[22] Filed: Oct. 16, 1978

[51] Int. Cl.² ............................................. H01J 40/14
[52] U.S. Cl. ............................ 250/214 AG; 250/214 R
[58] Field of Search ........ 250/214 R, 214 A, 214 AG

[56] References Cited

U.S. PATENT DOCUMENTS

| | | |
|---|---|---|
| 3,215,843 | 11/1965 | Neil . |
| 3,473,084 | 10/1969 | Dodge . |
| 3,516,751 | 6/1970 | Fruengel . |
| 3,558,892 | 1/1971 | Seeley . |
| 3,631,250 | 12/1971 | Buskirk . |
| 3,770,966 | 11/1973 | Sagawa et al. . |
| 3,772,514 | 11/1973 | Sunderland . |
| 3,830,567 | 8/1974 | Riegl . |
| 3,869,207 | 3/1975 | Hermet et al. . |
| 3,944,813 | 3/1976 | Fowler . |
| 3,967,904 | 7/1976 | Cade . |
| 4,075,474 | 2/1978 | Straus et al. . |
| 4,077,718 | 3/1978 | Graham et al. . |

Primary Examiner—David C. Nelms
Assistant Examiner—Darwin R. Hostetter
Attorney, Agent, or Firm—Richards, Harris & Medlock

[57] ABSTRACT

A system (10) for optimizing the gain of an avalanche photodiode (12) and an associated avalanche photodiode preamplifier (14) includes a variable voltage power supply (58) interconnected to the avalanche photodiode (12) for providing a bias voltage source for the avalanche photodiode (12). Circuitry (26, 28) is provided for measuring the output noise level of the avalanche photodiode (12) and preamplifier (14). Additional circuitry (46, 48) is responsive to the circuitry (26, 28) for measuring the output noise level of the avalance photodiode preamplifier (14) for generating a control signal. The control signal is applied to the variable voltage power supply (58) for varying the bias voltage applied to the avalanche photodiode (12) by the variable voltage power supply (58) to control the output noise level of the avalanche photodiode (12), such that the output noise level of the avalanche photodiode (12) matches the output noise level of the avalanche photodiode preamplifier (14) to thereby optimize the operation of the avalanche photodiode (12) and the avalanche photodiode preamplifier (14) combination.

21 Claims, 3 Drawing Figures

AVALANCHE PHOTODIODE GAIN CONTROL SYSTEM

TECHNICAL FIELD

This invention relates to avalanche photodiodes, and more particularly to a gain control for an avalanche photodiode and preamplifier system for optimizing the detection of optical signals.

BACKGROUND ART

Typically in the detection of optical signals PIN diodes have been utilized in connection with a preamplifier. However, thermal noise of the preamplifier is a limiting factor on system performance. To overcome this limitation, the avalanche photodiode (APD) was developed. The internal gain mechanism of an avalanche photodiode provides gain prior to the preamplifier, such that performance of the system is then limited by the shot noise of the avalanche photodiode due to either the detected signal, background signals or the detector leakage current.

Although avalanche photodiodes have eliminated several of the problems associated with PIN diodes, a problem associated with the operation of avalanche photodiodes is the maintenance of an optimum gain. The gain of an avalanche photodiode is a nonlinear function of temperature. Not only can the gain vary, but if the gain is not controlled the avalanche photodiode can go into full avalanche breakdown which can cause catastrophic and irreversible damage to the avalanche photodiode itself. A further problem associated with avalanche photodiodes is that the noise from the avalanche photodiode is also an increasing function of gain. Therefore, it is desirable to operate the avalanche photodiode such that the gain is just sufficient to bring the shot noise amplified by the avalanche process to the level of the thermal noise of the preamplifier. Furthermore, an application problem associated with avalanche photodiodes is that as the background level varies, the optimum value of gain varies.

Prior systems have attempted to overcome these problems associated with avalanche photodiodes by using a technique in which a reference avalanche photodiode is used for thermal stabilization and the gain is set by an applied voltage such that the user predetermines the desirable gain. A further prior system provides a temperature compensation circuit that is matched to a particular avalanche photodiode. This circuit senses a temperature change and predicts the associated variation in gain. The bias voltage is then adjusted to a predetermined level to maintain a constant gain. A further biasing technique is described and claimed in U.S. Pat. No. 3,869,207 issued to Hermet et al on Mar. 4, 1975, and entitled "Laser Transmitter" in which the bias voltage on an avalanche photodiode is controlled by maintaining the avalanche photodiode noise level constant. Another technique for biasing an avalanche photodiode is described and claimed in U.S. Pat. No. 4,077,718 issued to Graham, Jr. et al on Mar. 7, 1978, and entitled "Receiver for Optical Radar".

Such prior art systems have required the system to be operating synchronously with a transmitted pulse which is subsequently received as a reflection from a target. Such systems operate on a monopulse basis only and are not capable of controlling the gain of an avalanche photodiode in the presence of a continuous wave signal. Furthermore, such systems do not operate to optimize the noise from the avalanche photodiode to that of the avalanche photodiode preamplifier to optimize the performance of the entire system. Additionally, such prior systems have included circuitry and techniques for providing thermal stablization to avalanche photodiodes in an attempt to prevent full breakdown of avalanche photodiodes.

A need has thus arisen for a gain control for an avalanche photodiode in which the avalanche photodiode and associated avalanche photodiode preamplifier performance are optimized. A need has further arisen for a gain control for an avalanche photodiode operable in the presence of monopulse and pulse signals such as a DC level, video signal, or other CW signals or other signals of unknown waveforms. Furthermore, a need has arisen for a gain control for an avalanche photodiode in which the system is capable of operating asynchronously with respect to transmitted pulses, the reflections of which are to be detected by the avalanche photodiode. Additionally, a need has arisen for a gain control for an avalanche photodiode system for the control of noise to eliminate the requirement for thermal stabilization circuitry associated with avalanche photodiodes.

DISCLOSURE OF THE INVENTION

In accordance with the present invention, a system and method for optimizing the gain of an avalanche photodiode and an associated avalanche photodiode preamplifier is provided.

In accordance with the present invention, a system for optimizing the gain of an avalanche photodiode and an associated avalanche photodiode preamplifier includes a variable voltage power supply interconnected to the avalanche photodiode for providing a bias voltage source for the avalanche photodiode. Circuitry is provided for measuring the output noise level of the avalanche photodiode and preamplifier system and for generating a control signal. The control signal is applied to the variable voltage power supply for varying the bias voltage applied to the avalanche photodiode by the variable voltage power supply to control the output noise level of the avalanche photodiode, such that the output noise level of the avalanche photodiode matches the output noise level of the avalanche photodiode preamplifier thereby optimizing the operation of the avalanche photodiode and the preamplifier combination.

In accordance with another aspect of the present invention, a gain control for an avalanche photodiode includes a transimpedance amplifier interconnected to the output of the avalanche photodiode. A variable voltage power supply is interconnected to the avalanche photodiode for providing a bias voltage for the avalanche photodiode. Circuitry is provided for measuring the output noise level of the avalanche photodiode and transimpedance amplifier system and for generating a first signal corresponding to the output noise level of the avalanche photodiode and transimpedance amplifier system. Circuitry is further provided for generating a second signal corresponding to the output noise level of the transimpedance amplifier. Circuitry is also provided for comparing the first and second signals and for generating a control signal. The control signal is applied to the variable voltage power supply for varying the noise output level of the avalanche photodiode to match the output noise level of the transimpedance amplifier to thereby optimize the operation of the avalanche photodiode and transimpedance amplifier.

In accordance with yet another aspect of the present invention, a method of biasing an avalanche photodiode comprises applying a biasing voltage to the avalanche photodiode. The output noise level of the avalanche photodiode and preamplifier associated with the avalanche photodiode is measured. A signal is generated representing the output noise level of the avalanche photodiode preamplifier and a reference voltage is generated. The reference voltage is compared to the signal representing the output noise level of the avalanche photodiode and preamplifier system and a control signal is generated in response thereto. The biasing voltage is varied in response to the control signal for controlling the output noise level of the avalanche photodiode, such that the output noise level of the avalanche photodiode matches the output noise level of the avalanche photodiode preamplifier to thereby optimize the operation of the avalanche photodiode and avalanche photodiode preamplifier.

BRIEF DESCRIPTION OF THE DRAWINGS

For a more complete understanding of the present invention and for further objects and advantages thereof, reference is now made to the following detailed description taken in conjunction with the accompanying drawings in which.

DETAILED DESCRIPTION

Figure 1:
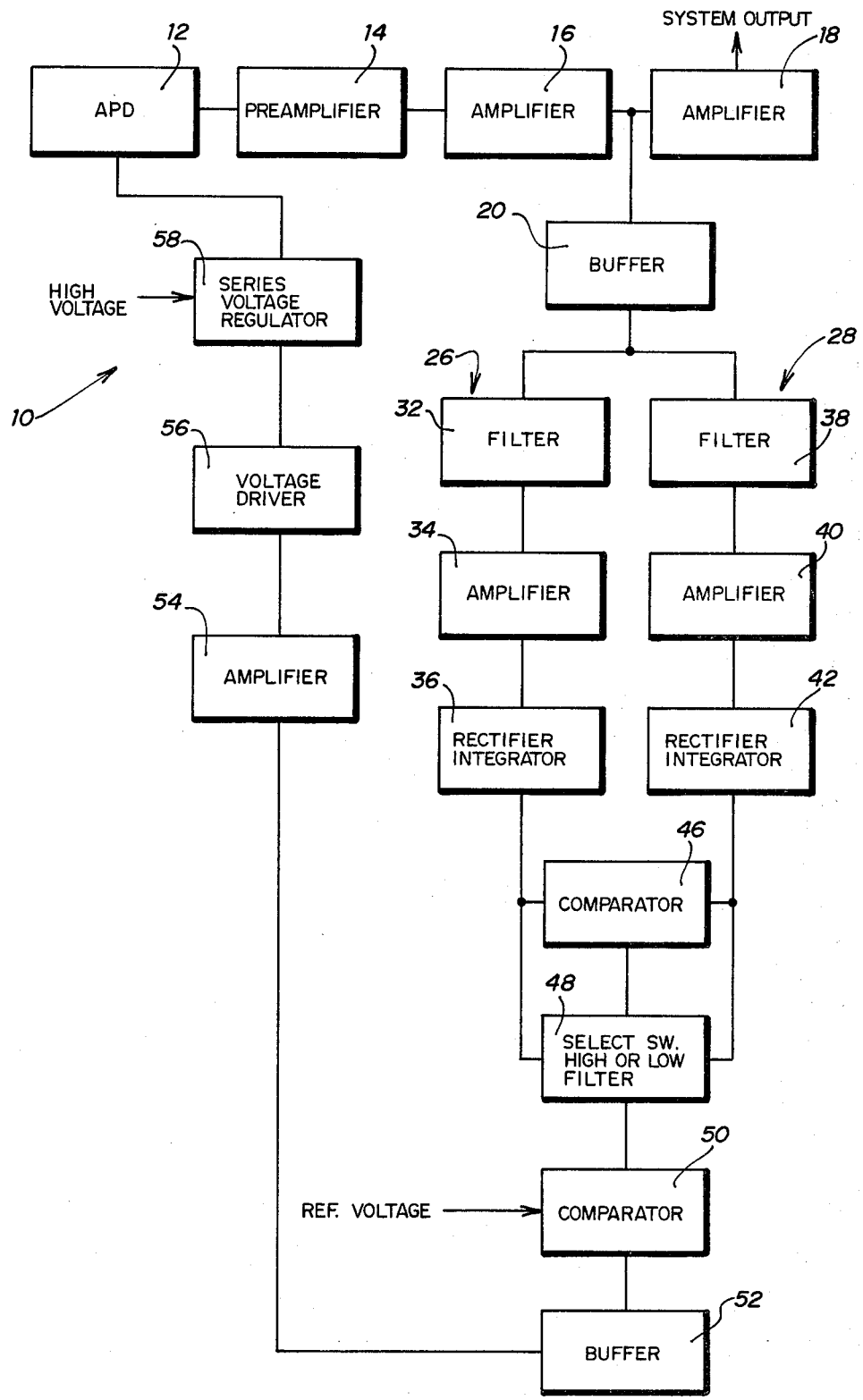
FIG. 1 is a block diagram of the present avalanche photodiode gain control system.

FIG. 1 illustrates the present avalanche photodiode gain control system generally identified by the numeral 10. The present system 10 includes an avalanche photodiode (APD) 12 which may comprise, for example, an avalanche photodiode Model No. C30905E manufactured and sold by RCA. The output of avalanche photodiode 12 is applied to a preamplifier 14. Preamplifier 14 is more particularly identified as a transimpedance amplifier associated with avalanche photodiode 12. An important aspect of the present invention is that the noise level at the output of the avalanche photodiode 12 is matched to the output noise level of preamplifier 14 in order to optimize the avalanche photodiode and preamplifier system.

As will be subsequently described, the present system 10 operates to measure the thermal noise of the preamplifier 14 due to the inherent operation of preamplifier 14 without an applied input signal. The system 10 then measures the output noise level of preamplifier 14 with the effect of the avalanche photodiode 12 input to adjust the biasing voltage applied to avalanche photodiode 12, such that the shot noise due to either the dark current of the avalanche photodiode 12 or the background signal of avalanche photodiode 12 will equal the preamplifier 14 output noise level to provide an optimum signal detection mechanism. Through this detection mechanism, by controlling the biasing voltage of avalanche photodiode 12, the system inherently provides thermal stabilization of the circuit such that the temperature need not be measured in order to provide system optimization.

The output of preamplifier 14 is applied to an amplifier 16 whose output is applied to an amplifier 18 which provides the system signal output detected by avalanche photodiode 12. The output signal of amplifier 16 is also applied to a buffer 20 for application to two control loops generally identified by the numerals 26 and 28. Control loop 26 comprises a low frequency control loop and includes a filter 32. The output of filter 32 is applied to an amplifier 34 whose output is applied to a rectifier-integrator 36. Control loop 28 comprises a high frequency control loop and includes a filter 38. The output of filter 38 is applied to an amplifier 40 whose output is applied to a rectifier-integrator 42. The use of control loops 26 and 28 permits the present system 10 to operate with the presence of unknown signals detected by avalanche photodiode 12 over the entire system frequency range. Filters 32 and 38 can be particularly selected to define a specific narrow portion of the spectrum over which the system noise is being examined. Therefore, the bandpasses of filters 32 and 38 can be selected such that any or all communication signals that have been examined can be received without affecting the noise measurement performed by the present system 10.

Rectifier-integrators 36 and 42 function to receive the system noise variations from control loops 26 and 28 and to convert these variations into a DC signal level for application to a comparator 46. Comparator 46 measures the DC level output from rectifier integrators 36 and 42 to provide a measurement of the RMS noise level on both the control loops 26 and 28. The output of comparator 46 is applied to a select switch 48 which also receives the outputs of rectifier-integrators 36 and 42. Select switch 48 functions to select the control loop 26 or 28 having the lowest noise level to apply this noise level as a signal to a comparator 50.

Comparator 50 also receives a reference voltage level which corresponds to a voltage equal to the noise level of preamplifier 14 operating in an ambient condition without an input signal supplied by avalanche photodiode 12. The output of comparator 50 is a control signal representing the variation in the voltage output of control loops 26 or 28 when compared to the reference voltage. The output of comparator 50 is applied to a buffer 52 whose output is applied to an amplifier 54. The output of amplifier 54 is applied to a voltage driver 56 which controls a series voltage regulator 58. Series voltage regulator 58 receives as an input a voltage from a high voltage source which provides a bias voltage for the avalanche photodiode 12. Series voltage regulator 58 functions to adjust the applied bias voltage or polarization voltage for avalanche photodiode 12.

In operation, in a dark out condition with no signal incident on avalanche photodiode 12, system 10 measures the noise from preamplifier 14 which establishes a reference voltage for application to comparator 50. The reference voltage level is then set to a value equal to the noise level of preamplifier 14 increased by a multiplication factor such as, in the preferred embodiment, 1.4 or the square root of 2. In this condition, the only noise measured by system 10 is that generated by preamplifier 14. The generated control signal applied to buffer 52 would then increase thereby increasing the bias voltage applied by series voltage regulator 58 to avalanche photodiode 12 until the noise level output of preamplifier 16 was set to the reference voltage level.

If the avalanche photodiode 12 is then exposed to a high ambient background such that the shot noise increases and exceeds the noise level of preamplifier 12, system 10 recognizes that the noise output level of preamplifier 14 now exceeds the noise level which would be attributed to the component of noise due only to amplifier 14 itself. System 10 then reduces the bias voltage applied to avalanche photodiode 12 to maintain the bias voltage level at the inherent noise of preamplifier 14, such as at a value of 1.4 times the reference voltage level. Both control loops 26 and 28 will then be providing identical controlling signals since the ambient background that avalanche photodiode 12 is exposed to is constant. If a signal is introduced to which avalanche photodiode 12 responds, such as a single pulse or monopulse, a pulse signal, a DC level signal, a video signal or any other CW signal, there will be a difference in the output of control loops 26 and 28 due to the frequency of these applied signals. For example, if avalanche photodiode 12 is exposed to a narrow pulse signal, the portion of this signal will be received by the control loop 26 or 28 having a high pass filter. Whichever control loop 26 or 28 receives a signal from avalanche photodiode 12 it will appear to system 10 that there is more noise in that control loop. Therefore, comparator 46 discriminates by selecting the control loop 26 or 28 having the lowest noise and uses that noise level to continue to control the biasing of avalanche photodiode 12.

The reference voltage level is established in the preferred embodiment as being 1.4 times the noise level of the preamplifier 14 and is determined according to the following expression:

$$i_{noise} = \sqrt{\frac{4KTBamp}{R} + 2eB(i_d + i_b + i_s)F(G)M} \quad (1)$$

where: $i_{noise}$ is set to $\sqrt{2}\,(\sqrt{4KTBamp/R})$;
$i_d$ = avalanche photodiode dark current;
$i_b$ = avalanche photodiode current due to background;
$i_s$ = avalanche photodiode current due to signal;
Bamp = bandwidth;
F(G) = excess noise factor, a function of gain, and polarization voltage;
M = gain of avalanche photodiode and preamplifier;
e = electronic charge, $1.6 \times 10^{19}$ coul; and
R = equivalent resistance of noise source.

Figure 2:
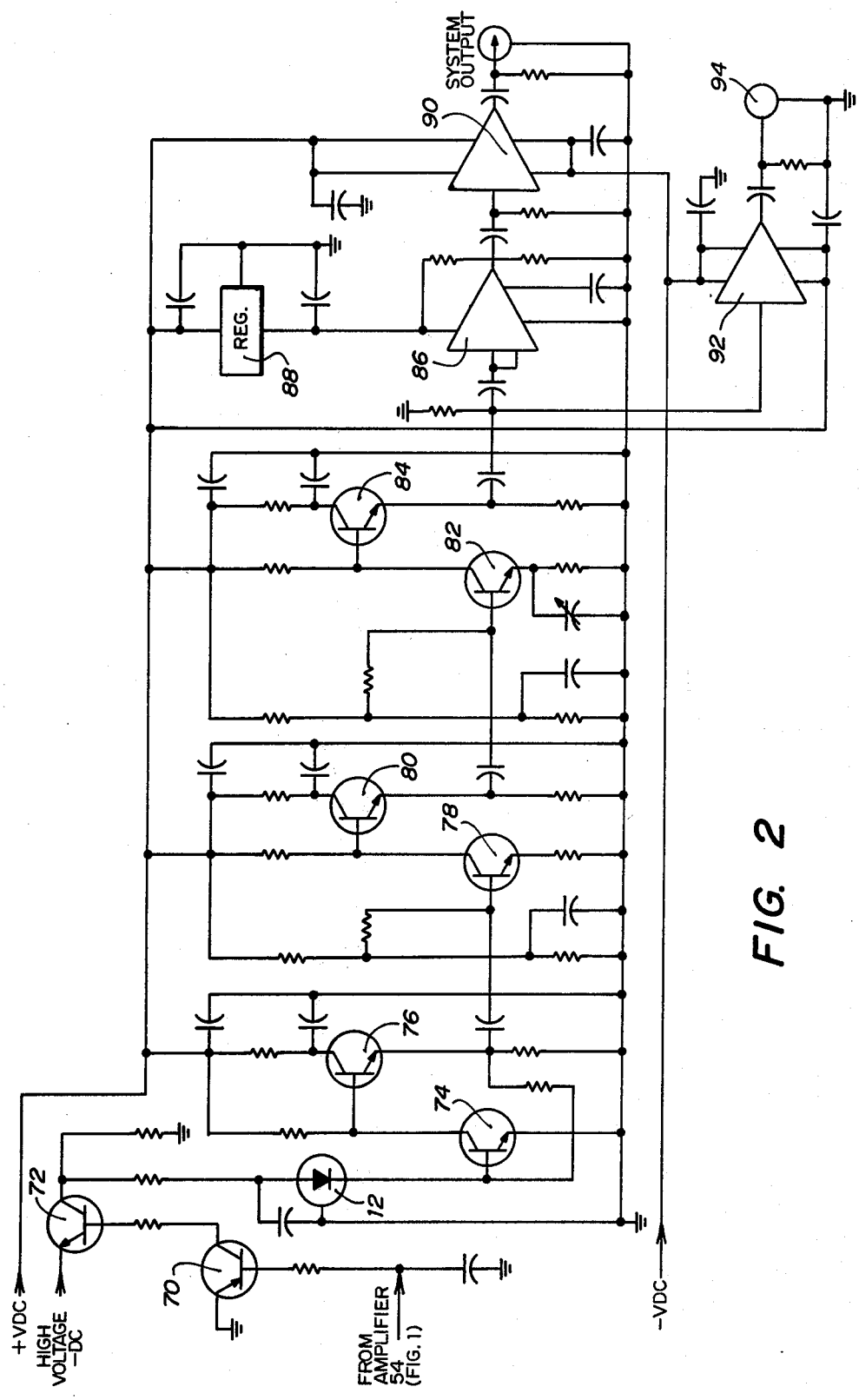
FIG. 2 is a schematic diagram of a portion of the present avalanche photodiode gain control system illustrated in block diagram form in FIG. 1.

Referring to FIG. 2, the circuitry corresponding to avalanche photodiode 12, preamplifier 14, amplifiers 16 and 18, buffer 20, voltage driver 56 and series voltage regulator 58 of FIG. 1 is illustrated. The output from amplifier 54 (FIG. 1) is applied to the base of a transistor 70 which comprises voltage driver 56 (FIG. 1). Transistor 70 functions as a voltage driver for driving a transistor 72 which receives the output of transistor 70 at the base of transistor 72. Transistor 72 also receives the high voltage bias supply voltage for avalanche photodiode 12. This biasing voltage in the preferred embodiment is approximately −400 volts DC. The output of transistor 72 is applied to avalanche photodiode 12. The output of avalanche photodiode 12 is applied to a transistor 74 whose output is applied to a transistor 76. Transistors 74 and 76 together with their associated biasing resistors and capacitors comprise preamplifier 14 (FIG. 1).

Transistors 74 and 76 are coupled to a transistor 78 whose output is applied to a transistor 80. Transistors 78 and 80 are coupled to a transistor 82 whose output is applied to a transistor 84. Transistors 78, 80, 82 and 84 and their associated biasing resistors and capacitors comprise the amplifier 16 (FIG. 1) and function to amplify the output voltage of preamplifier 14 by a factor of 25 in the preferred embodiment. Transistors 74, 76, 78, 80, 82 and 84 may comprise, for example, 2N4252 transistors.

The output of transistor 84 is applied to an amplifier 86 which may comprise, for example, an SL1610C wide band amplifier manufactured and sold by Presley. Amplifier 86 receives a biasing voltage from a voltage regulator 88 which in the preferred embodiment provides a regulated 8 volt supply to amplifier 86. The output of amplifier 86 is applied to an amplifier 90 which may comprise, for example, an LH0033CH fast buffer manufactured and sold by National Semiconductor. The output of amplifier 90 provides a 40 MHz system output signal. Amplifiers 86 and 90 comprise the amplifier block 18 (FIG. 1).

The output of transistors 84 is also applied to an amplifier 92 which may comprise, for example, an LH0002CH wide band amplifier manufactured and sold by National Semiconductor. Amplifier 92 comprises the buffer block 20 (FIG. 1) and provides an output to control loops 26 and 28 at terminal 94.

Figure 3:
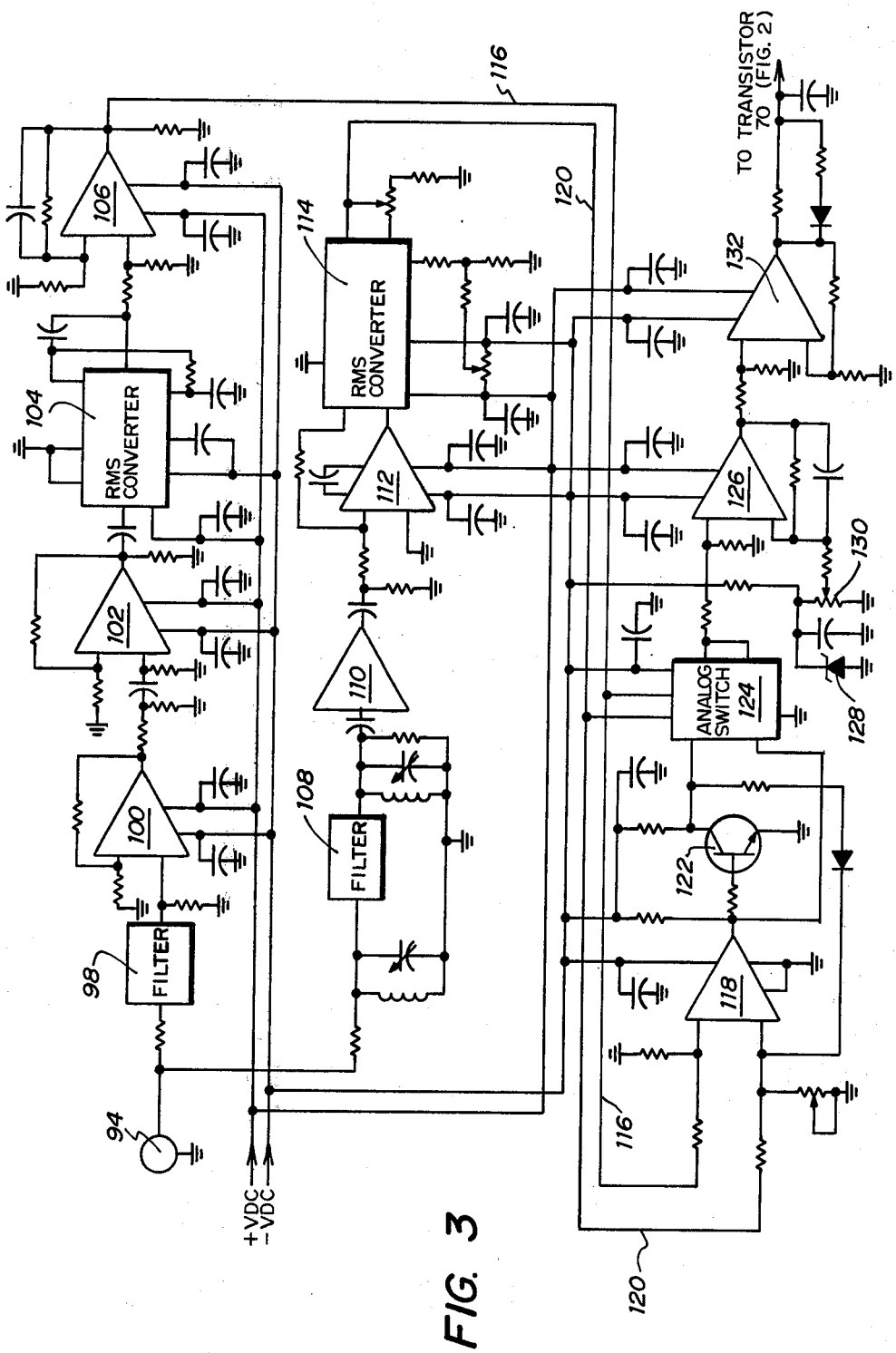
FIG. 3 is a schematic diagram of a portion of the present avalanche photodiode gain control system illustrated in block diagram form in FIG. 1.

Referring to FIG. 3, the output of amplifier 92 (FIG. 2) is applied to a filter 98. Filter 98 in the preferred embodiment is a 20 KHz low pass filter manufactured and sold by KR Electronics as Model Series 2. Filter 98 comprises the filter block 32 (FIG. 1).

The output of filter 98 is applied to an amplifier 100 whose output is applied to an amplifier 102. Amplifiers 100 and 102 may comprise, for example, MC1741 NCP operational amplifiers manufactured and sold by Motorola Semiconductor Products, Inc. Amplifiers 100 and 102 comprise the amplifier block 34 (FIG. 1). The output of amplifier 102 is applied to an RMS voltage converter 104 which may comprise, for example, an AD531J voltage converter manufactured and sold by Analog Devices. The output of RMS converter 104 is applied to an amplifier 106. Amplifier 106 may comprise, for example, an MC1741 NCP operational amplifier manufactured and sold by Motorola Semiconductor Products, Inc. RMS converter 104 and amplifier 106 comprise the rectifier integrator block 36 (FIG. 1).

The output of amplifier 92 (FIG. 1) is also applied to a filter 108. Filter 108 in the preferred embodiment comprises a 21.4 MHz crystal filter such as Model 2231 manufactured and sold by CTS Knight. Filter 108 comprises the filter block 38 (FIG. 1). The output of filter 108 is applied to an amplifier 110. Amplifier 110 may comprise, for example, an MC1552 RF broad band amplifier manufactured and sold by Motorola Semiconductor Products, Inc. The output of amplifier 110 is applied to an amplifier 112. Amplifier 112 may comprise, for example, an LH0032CG wide band operational amplifier manufactured and sold by National Semiconductor. Amplifiers 110 and 112 comprise the amplifier block 40 (FIG. 1). The output of amplifier 112 is applied to a thermal RMS converter 114. Thermal RMS converter 114 may comprise, for example, a Model 4130J manufactured and sold by Burr-Brown. Thermal RMS converter 114 comprises the rectifier-integrator block 42 (FIG. 1).

The output of amplifier 106 is applied along signal line 116 to a comparator 118. Comparator 118 also receives as an input signal the output of thermal RMS converter 114 along signal line 120. Comparator 118 may comprise, for example, an LM211D voltage comparator manufactured and sold by National Semiconductor. Comparator 118 comprises the comparator block 46 (FIG. 1). The output of comparator 118 is applied to a transistor 122 to drive an analog switch 124. Analog switch 124 may comprise, for example, an MC14066 BCP analog switch manufactured and sold by Motorola Semiconductor Products, Inc. and comprises the select switch 48 (FIG. 1). Analog switch 124 also receives the outputs of amplifier 106 and thermal RMS converter 114 along signal lines 116 and 120.

The output of analog switch 124 is applied to an amplifier 126. Amplifier 126 may comprise, for example, an MC1741 NCP operational amplifier manufactured and sold by Motorola Semiconductor Products, Inc. Amplifier 126 receives the reference voltage developed by a Zener diode 128 and an adjustable potentiometer 130. As previously described, the reference voltage established by Zener diode 128 and potentiometer 130 corresponds to the output noise level of preamplifier 14 (FIG. 1) increased by a predetermined multiplication factor.

The output of amplifier 126 is applied to an amplifier 132 which may comprise, for example, an MC1741 NCP low noise operational amplifier manufactured and sold by Motorola Semiconductor Products, Inc. The output of amplifier 132 is applied to the base of transistor 70 (FIG. 2) and comprises the control signal generated by control loops 26 and 28 (FIG. 1). Amplifier 132 comprises the buffer block 52 and amplifier block 54 of FIG. 1.

It therefore can be seen that the present system 10 provides a technique for optimizing the gain of an avalanche photodiode and associated preamplifier by monitoring the noise level at the output of the preamplifier and using this signal as a feedback or control signal for controlling the biasing voltage applied to the avalanche photodiode thereby controlling the avalanche photodiode gain. As a result, the avalanche photodiode and preamplifier combination can be maintained in an optimum, low noise, operating condition. As temperature changes and gain varies, the output noise level at the avalanche photodiode preamplifier will cause an automatic adjustment to the gain of the avalanche photodiode. The present system prevents the avalanche photodiode from going into full avalanche breakdown since prior to conducting in this range the excess noise function of avalanche gain becomes nonlinear and will effect a reduction in gain to thereby prevent full avalanche breakdown.

Whereas the present invention has been described with respect to specific embodiments thereof, it will be understood that various changes and modifications will be suggested to one skilled in the art and it is intended to encompass such changes and modifications as fall within the scope of the appended claims.

I claim:

1. A system for optimizing the gain of an avalanche photodiode and an associated avalanche photodiode preamplifier comprising:

variable voltage power supply means interconnected to the avalanche photodiode for providing a bias voltage source for the avalanche photodiode;

means for measuring the output noise level of the avalanche photodiode and the preamplifier;

means responsive to said measuring means for generating a control signal; and said control signal being applied to said variable voltage power supply means for varying said bias voltage applied to the avalanche photodiode by said variable voltage power supply means to control the output noise level of the avalanche photodiode, such that the output noise level of the avalanche photodiode matches the output noise level of the avalanche photodiode preamplifier to thereby optimize the operation of the avalanche photodiode and the avalanche photodiode preamplifier combination.

2. The system of claim 1 wherein said means for measuring the output noise level of the avalanche photodiode and preamplifier includes:

filter means for detecting the avalanche photodiode and preamplifier output noise level within a predetermined frequency range and for generating an output signal corresponding to the detected avalanche photodiode and preamplifier output noise level.

3. The system of claim 2 wherein said means responsive to said measuring means includes:

a voltage source for generating a reference voltage corresponding to the ambient output noise level of the avalanche photodiode and preamplifier; and means for comparing said reference voltage with said output signal for generating said control signal.

4. The system of claim 1 wherein said measuring means measures the shot noise of the avalanche photodiode and preamplifier.

5. The system of claim 1 wherein said measuring means continuously measures the output noise level of the avalanche photodiode and preamplifier.

6. A gain control for an avalanche photodiode comprising:

a transimpedance amplifier interconnected to the output of the avalanche photodiode;

variable power supply means interconnected to the avalanche photodiode for providing a bias voltage for the avalanche photodiode;

circuitry for measuring the output noise level of the avalanche photodiode and said transimpedance amplifier, said circuitry generating a first signal corresponding to the output noise level of the avalanche photodiode and said transimpedance amplifier;

means for generating a second signal corresponding to the output noise level of the transimpedance amplifier;

means for comparing said first and second signals and for generating a control signal; and said control signal being applied to said variable power supply means for varying the noise output level of the avalanche photodiode to match the output noise level of said transimpedance amplifier to thereby optimize the operation of the avalanche photodiode and transimpedance amplifier combination.

7. The gain control of claim 6 wherein said avalanche photodiode is activated by a continuous wave signal.

8. The gain control of claim 6 wherein the avalanche photodiode is activated by a pulse signal.

9. The gain control of claim 6 wherein the avalanche photodiode is activated by a DC voltage level signal.

10. The gain control of claim 6 wherein the avalanche photodiode is activated by a video signal.

11. The gain control of claim 6 wherein the avalanche photodiode is activated by a monopulse signal.

12. The gain control of claim 6 wherein said control signal is continuously generated.

13. The gain control of claim 6 wherein said circuitry for measuring the output noise level of the avalanche photodiode and said transimpedance amplifier includes:
filter means for detecting the avalanche photodiode and said transimpedance amplifier output noise level within a predetermined frequency range.

14. The gain control of claim 13 wherein said filter means includes:
first and second filter loops for detecting the avalanche photodiode and said transimpedance amplifier output noise level within first and second frequency ranges.

15. A system for optimizing the gain of an avalanche photodiode and associated avalanche photodiode preamplifier comprising:
variable voltage power supply means interconnected to the avalanche photodiode for providing a bias voltage source for the avalanche photodiode;
first filter means for measuring the output noise level of the avalanche photodiode and preamplifier within a first frequency range and for generating a first signal representative of the noise level of the avalanche photodiode and preamplifier;
second filter means for measuring the output noise level of the avalanche photodiode and preamplifier within a second frequency range and for generating a second signal representative of the noise level of the avalanche photodiode and preamplifier;
means for comparing said first and second signals and for selecting the signal having the lower noise level;
a voltage source for generating a reference voltage corresponding to the output noise level of the avalanche photodiode preamplifier;
circuitry for comparing said signal having the lower noise level of said first and second signals to said reference voltage and for generating a control signal; and
said control signal being applied to said variable voltage power supply means for varying said bias voltage to control the output noise level of the avalanche photodiode, such that the output noise level of the avalanche photodiode matches the output noise level of the avalanche photodiode preamplifier to thereby optimize the operation of the avalanche photodiode and avalanche photodiode preamplifier combination.

16. The system of claim 15 wherein said first and second filter means continuously measure the output noise level of the avalanche photodiode and preamplifier.

17. The system of claim 15 wherein the system operates asynchronously with respect to the avalanche photodiode.

18. A method of biasing an avalanche photodiode comprising:
applying a biasing voltage to the avalanche photodiode;
measuring the output noise level of an avalanche photodiode and preamplifier associated with the avalanche photodiode;
generating a signal representing the output noise level of the avalanche photodiode and preamplifier;
generating a reference voltage;
comparing said reference voltage to said signal to generate a control signal; and
varying the biasing voltage in response to said control signal for controlling the output noise level of the avalanche photodiode, such that the output noise level of the avalanche photodiode matches the output noise level of the avalanche photodiode preamplifier to thereby optimize the operation of the avalanche photodiode and avalanche photodiode preamplifier combination.

19. The method of claim 18 and further including:
continuously measuring the output noise level of the avalanche photodiode and preamplifier.

20. The method of claim 18 wherein the step of measuring the output noise level of the avalanche photodiode and preamplifier includes:
filtering the output of the avalanche photodiode preamplifier for measuring the output noise level of the avalanche photodiode and preamplifier within predetermined frequency ranges.

21. The method of claim 18 wherein the step of measuring the output noise level of the avalanche photodiode and preamplifier measures the shot noise of the avalanche photodiode and preamplifier.

* * * * *

UNITED STATES PATENT AND TRADEMARK OFFICE
Certificate

Patent No. 4,236,069                        Patented November 25, 1980

Richard H. Laughlin

Application having been made by Richard H. Laughlin, the inventor named in the patent above identified, and Varo, Inc., Garland, Tex., a Corp., of Tex., the assignee, for the issuance of a certificate under the provisions of Title 35, Section 256, of the United States Code, adding the names of Peter Sorensen, III and Thomas Forwood Whittaker as joint inventors, and a showing and proof of facts satisfying the requirements of the said section having been submitted, it is this 27th day of July 1982, certified that the names of the said Peter Sorensen, III and Thomas Forwood Whittaker are hereby added to the said patent as joint inventors with the said Richard H. Laughlin.

Fred W. Sherling
*Associate Solicitor.*